US006548410B2

(12) United States Patent
Kwon

(10) Patent No.: US 6,548,410 B2
(45) Date of Patent: *Apr. 15, 2003

(54) METHOD OF FABRICATING WIRES FOR SEMICONDUCTOR DEVICES

(75) Inventor: Tae Seok Kwon, Cheongju (KR)

(73) Assignee: Hyundai Electronics Industries Co., Ltd., Kyoungki-do (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/441,893

(22) Filed: Nov. 17, 1999

(65) Prior Publication Data

US 2002/0068461 A1 Jun. 6, 2002

(30) Foreign Application Priority Data

Apr. 8, 1999 (KR) ............................................. 99-12336

(51) Int. Cl.$^7$ ..................... H01L 21/302; H01L 21/3065
(52) U.S. Cl. ........................ 438/694; 438/700; 438/706; 438/712
(58) Field of Search ................................ 438/700, 706, 438/712, 694

(56) References Cited

U.S. PATENT DOCUMENTS

| 4,704,301 | A | * | 11/1987 | Bauer et al. ................. 438/618 |
| 5,231,053 | A | * | 7/1993 | Bost et al. ................... 438/627 |
| 5,286,674 | A | * | 2/1994 | Roth et al. ................... 438/624 |
| 5,288,664 | A | * | 2/1994 | Mukai ......................... 438/632 |
| 5,385,868 | A | * | 1/1995 | Chao et al. ................... 438/648 |
| 5,486,492 | A | * | 1/1996 | Yamamoto et al. .......... 438/692 |
| 5,702,869 | A | * | 12/1997 | Chien et al. ................. 430/313 |
| 5,756,396 | A | * | 5/1998 | Lee et al. .................... 438/622 |
| 6,066,558 | A | * | 5/2000 | Kawano et al. .............. 438/642 |

* cited by examiner

Primary Examiner—Benjamin L. Utech
Assistant Examiner—Lynette T. Umez-Eronini
(74) Attorney, Agent, or Firm—Morgan, Lewis & Bockius LLP

(57) ABSTRACT

A method of forming wires for semiconductor devices can restrict increase of a wires resistance and a contact resistance of the semiconductor device by forming a plug without generating a void or keyhole, and includes a step of forming an insulation film on lower wires, a step of forming a contact hole on the lower wires by selectively etching the insulation film, a step of performing a precleaning process by using an argon sputtering method until the lower wires at the lower portion of the contact hole are etched at a predetermined depth, a step of forming a plug by depositing a tungsten in the contact hole, and a step of forming upper wires on the plug and the second insulation film. A re-deposition layer consisting of a material of the lower wires is formed at the inner walls of the contact hole in the precleaning process, and thus a whole process is simplified by omitting a step of forming a glue layer or adhesion layer. In addition, a step coverage of the re-deposition layer is superior at the lower portion of the contact hole, and thus the tungsten plug is formed without generating the void or keyhole. As a result, the wires resistance and the contact resistance of the semiconductor device are reduced.

7 Claims, 5 Drawing Sheets

METHOD OF FABRICATING WIRES FOR SEMICONDUCTOR DEVICES

BACKGROUND OF THE INVENTION

1. Field of the Invention

The present invention relates to wires for semiconductor devices, and in particular to a method of fabricating wires for semiconductor devices suitable for a multi-layers wires constitution.

2. Description of the Background Art

A conventional method of fabricating wires for semiconductor devices will now be explained with reference to FIGS. 1a to 1h.

Referring to FIG. 1a, an oxide film is deposited on a semiconductor substrate 100 as a first insulation film 101. A titanium nitride (TiN) film is deposited on the first insulation film 101 as a glue layer 102. A tungsten film (W) which is a first conductive layer 103 is deposited on the glue layer 102.

Thereafter, a photoresist film pattern (not shown) is formed on the first conductive layer 103. The first conductive layer 103 and the glue layer 102 are etched by using the photoresist film pattern as a mask, and thus a first conductive layer pattern 103a is formed on the first insulation film 101, as illustrated in FIG. 1b. The first conductive pattern 103a is hereinafter referred to as lower wires 103a. The glue layer 102 formed under the first conductive layer is also patterned, and thus becomes a glue layer pattern 102a.

Referring to FIG. 1c, a silicon oxide film is formed at the upper portions of the lower wires 103a and the first insulation film 101 as a second insulation film. A photoresist film pattern 105 is formed at the upper portion of the second insulation film. The photoresist film pattern 105 has an opening 106 at a predetermined portion on the lower wires 103a.

As illustrated in FIG. 1d, the second insulation film 104 is selectively etched by a reactive ion etching (RIE) by using the photoresist film pattern 105 as a mask, thus forming a contact hole 107 or via hole 107 at a predetermined portion on the lower wires 103a.

As integration of the semiconductor devices is increased, the contact hole or via hole 107 is decreased in diameter (D). Recently, the contact hole is formed to have a diameter equal to or less than 0.2 μm. In addition, the improved integration of the semiconductor devices makes a height (h) of the contact hole or via hole 107 increased. As a result, an aspect ratio of the contact hole is increased, thus causing many problems in a process of fabricating wires in the semiconductor device.

The semiconductor substrate 100 illustrated in FIG. 1d is transferred to a device for depositing a metal film. As shown in FIG. 1e, while the semiconductor substrate 100 is transferred, a natural oxide film 108 is formed on an entire structure of the semiconductor substrate 100.

A precleaning process is carried out on the semiconductor substrate 100 as shown in FIG. 1e in order to remove the natural oxide film 108. As the precleaning process, there are used a wet etching of dipping and rinsing the semiconductor substrate in an HF solution or a sputtering method using an argon (AR) gas. When the AR sputtering method is employed, process conditions are as follows.

Pressure in chamber: approximately 2 mTorr
Source power for generating a plasma: 400 W(13.56 MHz)
Bias power: 270 W(400 KHz)
Process time: 10 seconds
Ar gas flowing amount: 10 cc/min Thereafter, referring to FIG. 1f, a titanium (Ti) film or a titanium nitride (TiN) film is formed as an adhesion layer or a glue layer 109 on the entire structure of the semiconductor substrate 100 where the natural oxide film 108 is removed, namely at the upper portion of the second insulation film 104 and the inner wall and lower portion of the contact hole or via hole 107. A metal layer, especially a tungsten is not deposited well on the silicon oxide film which composes the second insulation film 103.

Accordingly, the adhesion layer or glue layer 109 is formed so that the metal layer can be firmly adhered at the upper portion of the second insulation film 104 and in the contact hole 107, during a process for forming upper wires, namely a process for depositing a metal layer.

Then, the tungsten film 110 is deposited on the adhesion layer or glue layer 109 by a chemical vapor deposition. The tungsten film 110 is deposited at a sufficient thickness to fill up the contact hole 107, and thus is also formed on the adhesion layer 109 at the upper portion of the second insulation film 110. As shown in FIG. 1g, a chemical mechanical polishing (CMP) or an etchback process is carried out on the tungsten film 110, thereby removing the tungsten film deposited on the second insulation film 104. As a result, a tungsten plug 110a is formed in the contact hole 107.

Referring to FIG. 1h, a metal film is formed as a conductive layer on the entire structure in FIG. 1f, and patterned, thus forming the upper wires 111.

In accordance with the conventional method of fabricating the wires for the semiconductor devices, the tungsten is not deposited well on the insulation film, especially on the oxide film. Therefore, it is required to form the glue layer or adhesion layer on the second insulation film and at the inner walls of the contact hole before forming the tungsten plug.

In addition, after the blanket tungsten film is formed on the entire structure of the semiconductor substrate in order to form the tungsten plug, while the tungsten film at the upper portion of the insulation film is removed by the etchback or CMP process, a number of particles are generated, and thus a fabricating rate of the semiconductor device is reduced.

Besides, the etchback or CMP process is further included, as compared with the process of selectively filling the tungsten in the contact hole. Accordingly, the fabricating process of the semiconductor device is more complicated.

As shown in FIG. 2, in case of a contact hole 200 having a high aspect ratio, a step coverage of the adhesion layer 201 is inferior at the lower portion of the contact hole 200, and as a result the tungsten film is not deposited well thereon. After the tungsten plug 202 is formed, a void 203 is formed at the lower portion of the contact hole 200, and thus a contact between the tungsten plug 202 and the lower wires 204 is inferior, and a contact resistance is increased.

When the adhesion layer is formed thicker in order to improve its step coverage at the lower portion of the contact hole, an overhang takes place at the edge portions of the entrance of the contact hole, and thus a keyhole is generated at the lower portion of the contact hole after deposition of the tungsten film, thereby increasing a wires resistance.

SUMMARY OF THE INVENTION

It is therefore a primary object of the present invention to provide a method of fabricating wires for semiconductor devices having a low wires resistance and a low contact resistance.

It is another object of the present invention to provide a method of fabricating wires for semiconductor devices which can reduce a wires resistance and a contact resistance merely by changing conditions of a precleaning process carried out when fabricating the wires for the semiconductor devices.

It is still another object of the present invention to provide a method of fabricating wires for semiconductor devices which can increase a fabricating rate of the semiconductor devices by omitting an etchback process and preventing generation of particles, and which can improve productivity by simplifying a fabricating process.

It is still another object of the present invention to provide a method of fabricating wires for semiconductor devices which can simplify a fabricating process by omitting a process of forming an adhesion layer performed before forming a plug.

In order to achieve the above-described objects of the present invention, there is provided a method of fabricating wires for semiconductor devices including: a step of forming a first insulation film; a step of forming lower wires on the first insulation film; a step of forming a second insulation film on the lower wires; a step of forming a contact hole on the lower wires by selectively etching the second insulation film; a step of performing a precleaning process by using an argon (AR) sputtering method until the lower wires at the lower portion of the contact hole are etched at a predetermined depth; a step of selectively forming a conductive plug in the contact hole; and a step of forming upper wires at the upper portions of the conductive plug and the second insulation film, a re-deposition layer consisting of a material of the lower wires being formed at the inner walls of the contact hole in the precleaning process.

In accordance with the method of fabricating the wires for the semiconductor devices of the present invention, the precleaning process is a step of sputtering for approximately 25 seconds in the conditions of a source power of 500 W, a bias power of 250 W, an argon gas flowing amount of 5 cc/min, and a pressure in a chamber of 0.5 mTorr.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE INVENTION

A method of fabricating wires for semiconductor devices in accordance with the present invention will now be described in reference to the accompanying drawings.

Figure 1A:
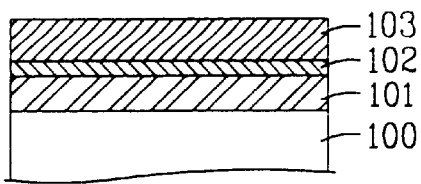
FIGS. 1a through 1h are vertical-sectional views sequentially illustrating a conventional process of fabricating wires for semiconductor devices.
Figure 1B:
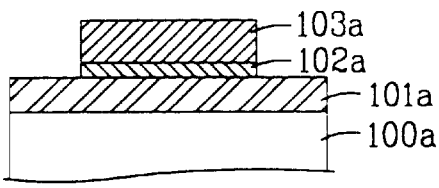
Figure 1C:
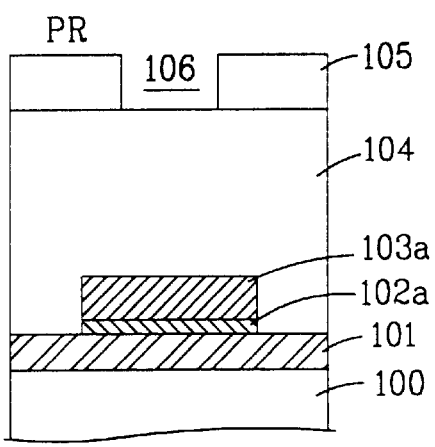
Figure 1D:
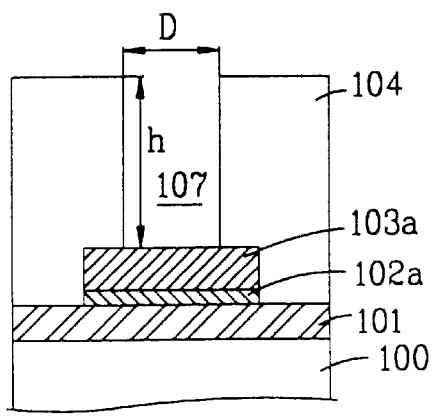
Figure 1E:
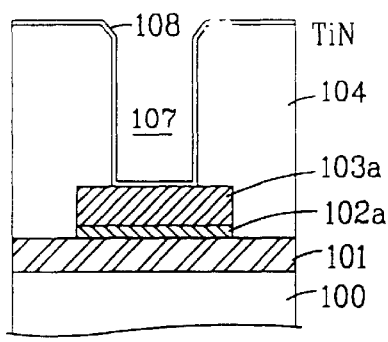
Figure 1F:
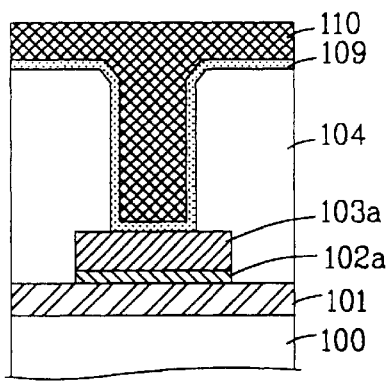
Figure 1G:
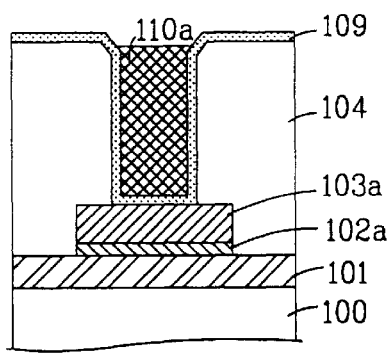
Figure 1H:
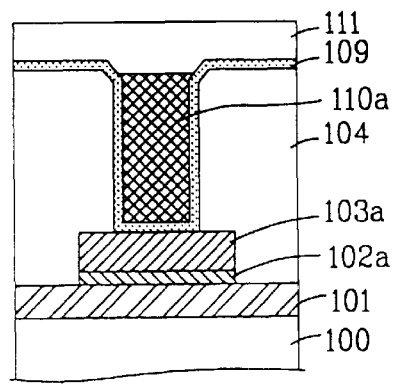
Figure 2:
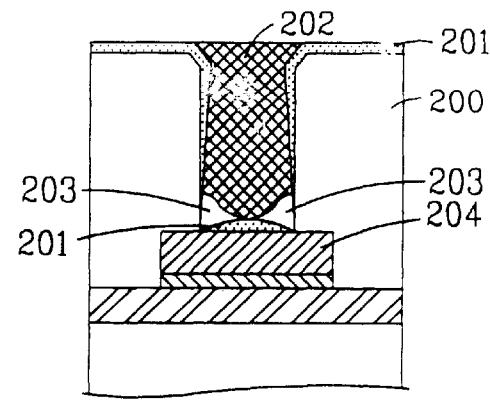
FIG. 2 is a vertical-sectional view illustrating a wires structure for the semiconductor device fabricated by the conventional process.
Figure 3A:
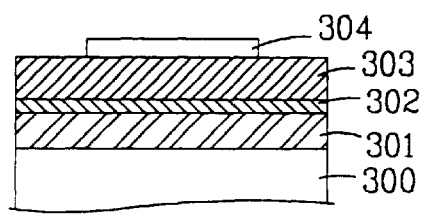
FIGS. 3a through 3g are vertical-sectional views sequentially illustrating a process of fabricating wires for semiconductor devices according to the present invention.

Referring to FIG. 3a, a first insulation film 301 is formed on a semiconductor substrate 300. A titanium nitride (TiN) film is deposited on the first insulation film 301 as a glue layer 302. A tungsten film 303 which is a conductive layer is formed on the glue layer 302. Then, a photoresist film pattern 304 is formed on the tungsten film 303.

Figure 3B:
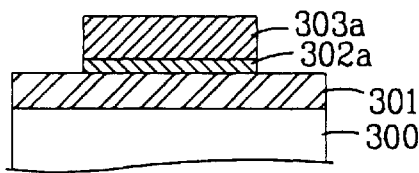

The tungsten film 303 and the TiN film 302 are etched by using the photoresist film pattern 304 as a mask, thus forming a tungsten film pattern 303a and the TiN film pattern 302a, as shown in FIG. 3b. The tungsten film pattern 303a is operated as lower wires 303a for the semiconductor device, and a thickness thereof is approximately 5000 Å.

Figure 3C:
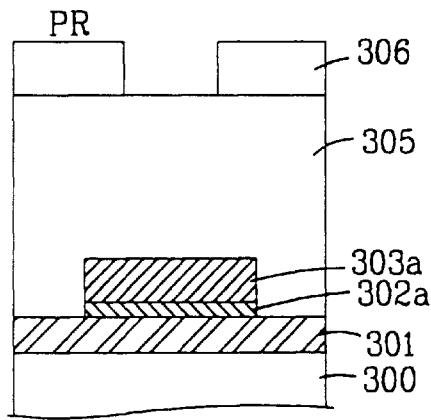

Referring to FIG. 3c, a silicon oxide film is formed as a second insulation film 305 at the upper portions of the lower wires 303a and the first insulation film 301. A photoresist film pattern 306 is formed on the second insulation film 305.

Figure 3D:
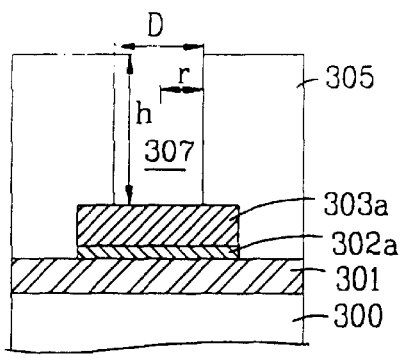

As depicted in FIG. 3d, the second insulation film 305 is selectively etched by using the photoresist film pattern 306 as a mask, and thus a contact hole 307 or via hole 307 is formed at a predetermined portion on the lower wires 303a. A diameter, a radius and a depth of the via hole or contact hole 307 are indicated as 'D', 'r' and 'h', respectively.

Thereafter, a precleaning process is carried out on the semiconductor substrate 300 in FIG. 3d. The precleaning process employs an argon sputtering method, and its process conditions are as follows.

Pressure in a sputtering chamber: 0.5 mTorr

Source power for generating a plasma: 550 W(13.56 MHz)

Bias power: 250 W(400 KHz)

Argon gas flowing amount: 5 cc/min

Sputtering time: 25 seconds

A natural oxide film and contaminants such as particles are removed by the precleaning process.

Figure 3E:
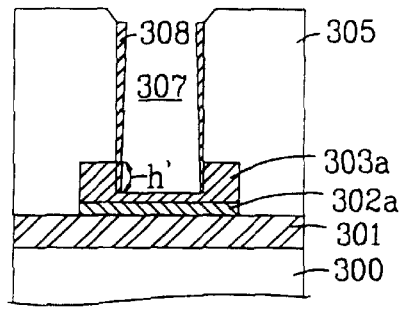

FIG. 3e illustrates a structure on the semiconductor substrate 300 after performing the precleaning process by using an aluminum sputtering method in the above conditions. That is, the upper portion of the lower wires 303a at the lower portion of the contact hole 304 is etched by approximately 100 Å to 600 Å. In addition, the tungsten re-deposition layer 308 of approximately 50 Å is formed at the inner walls of the contact hole 307. A principle of forming the tungsten re-deposition layer 308 is as follows.

Figure 4:
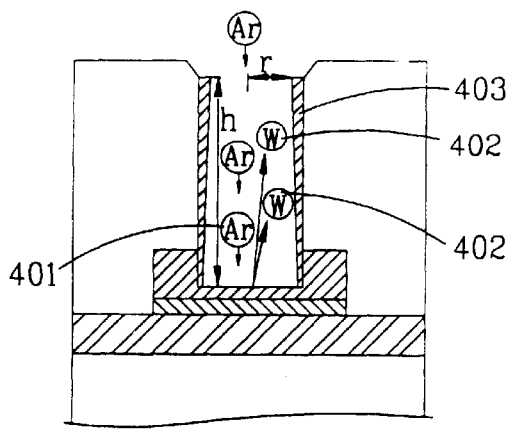
FIG. 4 is a schematic view illustrating a principle of forming a tungsten re-deposition layer at inner walls of a contact hole according to the present invention.

That is, as shown in FIG. 4, argon ions 401 are sputtered in the sputtering chamber, and thus bombards the lower wires 303a. Tungsten ions 402 at a portion of the lower wires 303a impacted by the AR ions jump out, and thus an etching is performed. As illustrated in FIG. 4, some tungsten ions 402 are adhered to the inner walls of the contact hole 307, thus forming a tungsten re-deposition layer 403. Here, the tungsten ions 402 are easily adhered to the lower inner walls of the contact hole 307 because they are positioned nearer. The step coverage of the tungsten re-deposition layer at the lower portion of the contact hole 307 is superior, differently from the conventional method of forming the adhesion layer or glue layer, and thus the present invention overcome the problems such as increase of a wires resistance and a contact resistance resulting from a void or keyhole generated during the plug formation.

Figure 3F:
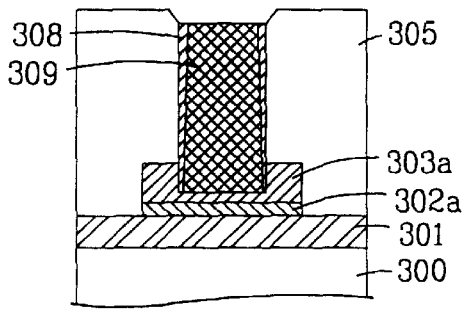

Referring to FIG. 3f, a tungsten plug 309 is selectively deposited in the contact hole 307. As a method for selectively depositing the tungsten plug 309, a hydrogen reduction of $WF_6$ gas and a low pressure chemical vapor deposition (LPCVD) using a silane ($SIH_4$) reduction may be employed. That is, the tungsten re-deposition layer 308 formed in the contact hole 307 is operated as a core for depositing the tungsten plug 309. Accordingly, the tungsten is selectively deposited in the contact hole 307, and is not deposited at the upper portion of the second insulation film 305. It is because the second insulation film 305 consists of an oxide film, especially a silicon oxide film, and the tungsten is not well deposited thereon. Therefore, differently from the conventional method, the etchback process is not required when the tungsten plug is formed.

Figure 3G:
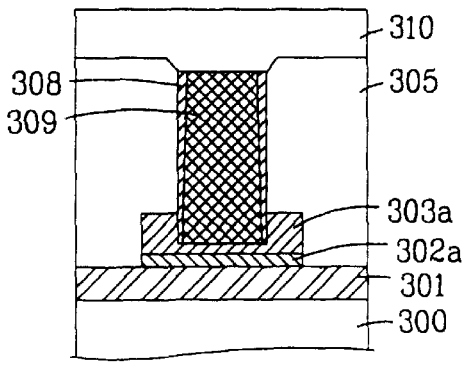

Thereafter, as shown in FIG. 3g, a conductive layer is formed and patterned at the upper portions of the second insulation film 305 and the tungsten plug 309, thereby forming upper wires 310. It is advantageous that the upper wires 310 consist of one of aluminum, tungsten and copper.

Figure 5:
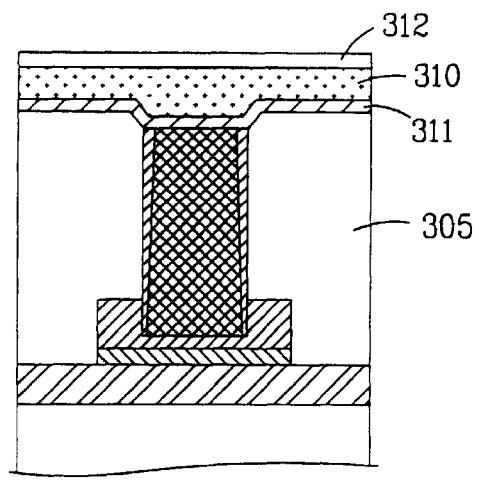
FIG. 5 is a vertical-sectional view illustrating a wires structure for a semiconductor device in accordance with another embodiment of the present invention.

Referring to FIG. 5, a titanium (Ti), a titanium nitride (TiN) film or a tantalum nitride (TaN) film may be formed on the second insulation film 305 as an adhesion layer 311 before forming a metal film such as a tungsten film, an aluminum film or a copper film which is the upper wires. Especially, in the case that the upper wires 310 consist of the copper film, it is preferable to form a diffusion barrier film 312 at the upper portion of the upper wires 310. The diffusion barrier film 312 advantageously consist of the titanium (Ti), the titanium nitride (TiN) film, the tantalum nitride (TaN) film or the tungsten nitride (WNx) film.

Figure 6:
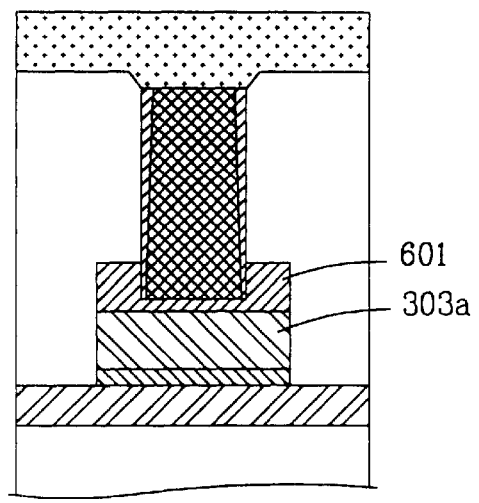
FIG. 6 is a vertical-sectional view illustrating a wires structure in semiconductor devices in accordance with a third embodiment of the present invention.

According to another embodiment of the present invention, as shown in FIG. 6, the lower wires 303a may also consist of the copper (Cu). In this case, it is preferable to form a diffusion barrier layer 601 on the lower wires 303a. A thickness of the diffusion barrier layer 601 is set between 100 Å and 600 Å. That is, it is necessary to set the thickness of the diffusion barrier layer greater than a thickness to be etched in the precleaning process. When the copper is merely used as the lower wires, the copper ions may be adhered to the inner walls of the contact hole, namely the sidewalls of the second insulation film due to the sputtering of the AR ions during the precleaning process. As a result, the copper ions are rapidly diffused to the second insulation film (especially in the case of an oxide film). Accordingly, the diffusion barrier layer is formed on the lower wires consisting of the copper, and thus the re-deposition layer consisting of the material of the diffusion barrier layer is formed at the inner walls of the contact hole during the precleaning process. Thereafter, the copper ions are deposited on the surface of the re-deposition layer, thereby preventing the copper ions from being diffused into the second insulation film. The diffusion barrier layer may consist of the tungsten nitride (WNx) film, the titanium nitride (TiN) film or the tantalum nitride (TaN) film.

According to a third embodiment of the present invention, the tungsten nitride film, the titanium nitride film and the tantalum nitride film may also be used as the material of the lower wires.

The operational principle of the present invention will now be described. In the precleaning conditions of the present invention, a mean free path of the etching gas ions (for example, the argon gas) is increased, and a straightness of the ions is improved. That is, a difference between a source power and a bias power is increased from 130 W(400 W–270 W) to 300 W(550 W–250 W), thereby improving the straightness of the ions. In addition, a pressure in the chamber is reduced from 2 mTorr to 0.5 mTorr, and a flowing amount of the Argon gas is decreased from 10 cc/min to 5 cc/min, thereby increasing the mean free path of the ions. As the precleaning process is varied, the natural oxide film is removed, the upper portion of the lower wires is etched at a predetermined degree, and the material of the etched lower wires is re-deposited to the inner walls of the contact hole. The re-deposition film consisting of the material of the lower wires serves as the glue layer during the plug formation which is succeedingly performed. Consequently, the plug can be formed in the contact hole without generating the void or keyhole.

According to the present invention, the plug is formed in the contact hole without generating the void or key hole, thus restricting increase of the wires resistance and contact resistance of the semiconductor device.

According to the present invention, the etchback process is omitted in forming the plug in the contact hole, and thus the whole process is simplified , Also, few particles are generated, and thus a fabricating rate of the semiconductor devices is increased.

According to the present invention, the process for forming the glue layer or adhesion layer which is performed before forming the plug is omitted, thereby simplifying the whole process.

In addition, in accordance with the present invention, a contact area between the plug in the contact hole and the lower wires is increased, and thus the wires resistance of the semiconductor device is reduced. As shown in FIG. 3f, the lower wires 303a is etched by h', and thus a contact area between the plug and the lower wires is increased by an area of the inner walls of the contact hole corresponding to the etching depth. The increased contact area is equal to a value obtained by multiplying "2pr" (a length of a circumference of the contact hole, 'r' is a radius of the contact hole) by "h'" (an etching depth of the lower wires).

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A method of fabricating wiring for semiconductor devices comprising the steps of:

forming a first insulation film;

forming a lower wire on the first insulation film;

forming a second insulation film on the lower wire;

forming a contact hole on the lower wire by selectively etching the second insulation film;

partially etching the lower wire at a lower portion of the contact hole to form a re-deposition layer from the lower wire on inner walls of the contact hole;

forming a conductive plug in contiguous contact with the re-deposition layer in the contact hole; and forming an upper wire at upper portions of the conductive plug and the second insulation film.

2. The method according to claim 1, wherein the etching is for approximately 25 seconds in the conditions of a source power of 500 W, a bias power of 250 W, an argon gas flowing amount of 5 cc/min and a pressure in a chamber of 0.5 m Torr.

3. The method according to claim 1, wherein the lower wire includes one of a tungsten, a titanium, a titanium nitride film, a tantalum nitride film and a tungsten nitride film.

4. The method according to claim 1, wherein the lower wire is approximately 5000 Å thick.

5. The method according to claim 1, wherein the lower wire is etched to a depth of approximately between 100 Å and 600 Å.

6. The method according to claim 1, wherein the re-deposition layer is approximately 50 Å thick.

7. The method according to claim 1, wherein the re-deposition layer is approximately 50 angstroms thick.

* * * * *